(12) United States Patent
Pellegrini et al.

(10) Patent No.: US 12,355,185 B2
(45) Date of Patent: Jul. 8, 2025

(54) CASE FOR ELECTRONIC DEVICES

(71) Applicant: LUXOTTICA S.R.L., Agordo (IT)

(72) Inventors: Daniele Pellegrini, Belluno (IT); Enrico Toigo, Agordo (IT)

(73) Assignee: LUXOTTICA S.R.L., Agordo (IT)

( * ) Notice: Subject to any disclaimer, the term of this patent is extended or adjusted under 35 U.S.C. 154(b) by 64 days.

(21) Appl. No.: 18/559,472

(22) PCT Filed: Apr. 27, 2022

(86) PCT No.: PCT/EP2022/061242
§ 371 (c)(1),
(2) Date: Nov. 7, 2023

(87) PCT Pub. No.: WO2022/233679
PCT Pub. Date: Nov. 10, 2022

(65) Prior Publication Data
US 2024/0243518 A1    Jul. 18, 2024

(30) Foreign Application Priority Data
May 7, 2021  (IT) .......................... 102021000011705

(51) Int. Cl.
*G02C 11/00*    (2006.01)
*A45C 11/04*    (2006.01)
(Continued)

(52) U.S. Cl.
CPC .......... *H01R 13/6205* (2013.01); *A45C 11/04* (2013.01); *H02J 7/0044* (2013.01);
(Continued)

(58) Field of Classification Search
CPC .... H01R 13/6205; A45C 11/04; H02J 7/0044; H05K 5/0086; H05K 5/0208;
(Continued)

(56) References Cited

U.S. PATENT DOCUMENTS 10,993,515 B1    5/2021  Kim et al.
11,366,341 B1 *  6/2022  Kubota ................. A45C 15/00
(Continued)

FOREIGN PATENT DOCUMENTS

CN    111538173 A    8/2020
EP    1452108 B1    11/2009

OTHER PUBLICATIONS

International Search Report for International Application No. PCT/EP2022/061242, dated Sep. 9, 2022, 3 pages.
(Continued)

*Primary Examiner* — Jacob K Ackun
(74) *Attorney, Agent, or Firm* — CANTOR COLBURN LLP

(57) ABSTRACT

A case for electronic devices, which includes a case body that is adapted to accommodate an electronic device, and is provided with at least one receptacle for the electronic device; retention elements being arranged at the at least one receptacle of the electronic device. At least one of the retention elements is provided with charging elements, the retention elements being adapted to pass from an inactive position to an active position, in contrast with the action of elastic elements, in which the retention elements contact a charging area of the electronic device and at the same time lock the electronic device inside the case body when the electronic device is stored inside the case body.

12 Claims, 5 Drawing Sheets

(51) Int. Cl.
  *H01R 13/62* (2006.01)
  *H02J 7/00* (2006.01)
  *H05K 5/00* (2006.01)
  *H05K 5/02* (2006.01)

(52) U.S. Cl.
  CPC ......... *H05K 5/0086* (2013.01); *H05K 5/0208* (2013.01); *G02C 11/10* (2013.01); *G02C 2200/02* (2013.01)

(58) Field of Classification Search
  CPC ................ G02C 11/10; G02C 2200/02; G02C 2200/08; G02C 7/083; G02C 5/146
  USPC ......................................................... 206/5, 6
  See application file for complete search history.

(56) References Cited

U.S. PATENT DOCUMENTS

2020/0241329 A1    7/2020  Hanover et al.
2022/0346268 A1*  10/2022  Park ...................... G06F 1/1632
2022/0360290 A1*  11/2022  Earley, Jr. .............. A45C 11/04

OTHER PUBLICATIONS

Italian Search Report for Italian Application No. 202100011705, dated Jan. 19, 2022, 8 pages.
Written Opinion for International Application No. PCT/EP2022/061242, dated Sep. 9, 2022, 7 pages.

* cited by examiner

CASE FOR ELECTRONIC DEVICES

CROSS-REFERENCE TO RELATED APPLICATIONS

This application is a 35 U.S.C. § 371 National Stage patent application of PCT/EP2022/061242 filed 27 Apr. 2022, which claims the benefit of Italian patent application 102021000011705 filed 7 May 2021, the disclosures of which are incorporated herein by reference in their entirety.

TECHNICAL FIELD

The present disclosure relates to a case for electronic devices. More specifically the disclosure relates to a case for electronic eyeglasses. Even more specifically, the disclosure relates to a case for electronic eyeglasses that enables the eyeglasses to be charged when they are accommodated in the case.

BACKGROUND

As is known, electronic eyeglasses are increasingly widespread on the market. The term electronic eyeglasses means eyeglasses that are provided with various electronic functionalities, such as temperature sensors, video cameras and the like. Such electronic eyeglasses must obviously be charged before their use, in order to be able to take advantage of their electronic potential.

The charging of the eyeglasses occurs, generally, using a charging cable, or when they are placed in their case. In the conventional type of case used to charge eyeglasses, when the temple of the eyeglasses is in the folded position the eyeglasses can engage with a charging system made up of pins and magnets which are arranged at at least one end of the eyeglasses case.

The pins and the magnets are combined so as to be able to position the eyeglasses so that the pins and the magnets come into contact with the part of the eyeglasses used for charging, which is located at the region of the frame or of the temple proximate to the hinge.

In substance, the eyeglasses rest with the folded temple at the pins and magnets, in order to be able to effect the contact and start the charging process.

Charging systems are known in the state of the art in which an electronic connector arranged on the charging case engages or connects electronically with a corresponding connector arranged on the electronic eyeglasses. In some cases, such electronic connector comprises magnets or other mechanisms for retaining the electronic eyeglasses at a fixed receptacle, for the purpose of carrying out the charging and/or the transfer of data.

Charging systems are also known in the state of the art in which the charging interface is of the magnetic type and comprises two protruding circular magnets and two copper posts. The copper post is fixed to a spring so that the copper post can pass from a position of contact to a position of non-contact, thus making it possible for the copper posts to be completely in contact with the charging area located on the temple.

However, the above solutions exhibit some drawbacks which are due to the fact that they do not offer an optimal mating between eyeglasses and case, and therefore they require an action by the user to properly position it so that it does not come out from the charging system.

Furthermore, given that the eyeglasses are simply placed at the charging system located at one of the two mutually opposite ends of the case, it is necessary to immobilize the eyeglasses, for example at the nosepiece, in order to prevent them from moving around inside the case, thus negatively influencing the charging, given that it may happen that the eyeglasses lose contact with the pins and the magnets of the charging system.

SUMMARY

Therefore, the solution offered by the prior art does not ensure that the eyeglasses, once arranged even optimally in their case, can continue to be charged without problems, even if the user moves the case, carries it from one point to another, and in any case subjects it to knocks and jolts.

The aim of the present disclosure is to provide a case for electronic devices, which makes it possible to charge an electronic device contained in it, while ensuring that the device is engaged precisely and firmly, without potential separations, inside the case.

Within this aim, the present disclosure provides a case for electronic devices in which the user does not need to take care to position the device manually and very accurately for it to be in the conditions for charging.

The present disclosure provides a case for electronic devices that reduces to the minimum the action that the user needs to carry out in order to ensure that the device placed in the case is charged.

The present disclosure also provides a case for electronic devices that is such as to make it possible to charge a pair of electronic eyeglasses without requiring retention devices at the nosepiece of the eyeglasses, in order to prevent the eyeglasses from moving away from the charging systems provided.

the present disclosure further provides a case for electronic devices that is highly reliable, easily and practically implemented and of low cost.

This aim and these and other advantages that will become more apparent hereinafter are achieved by providing a case for electronic devices, which comprises a case body that is adapted to accommodate an electronic device, and is provided with at least one receptacle for the electronic device, characterized in that it comprises retention means arranged at said at least one receptacle of the electronic device, at least one of said retention means being provided with charging means, said retention means being adapted to pass from an inactive position to an active position, in contrast with the action of elastic means, in which said retention means contact a charging area of said electronic device and at the same time lock said electronic device inside said case body when said electronic device is stored inside said case body.

BRIEF DESCRIPTION OF THE DRAWINGS

Further characteristics and advantages of the disclosure will become better apparent from the detailed description of a preferred, but not exclusive, embodiment of the case for electronic devices according to the present disclosure, illustrated by way of non-limiting example in the accompanying drawings wherein.

DETAILED DESCRIPTION OF THE DRAWINGS

Figure 1:
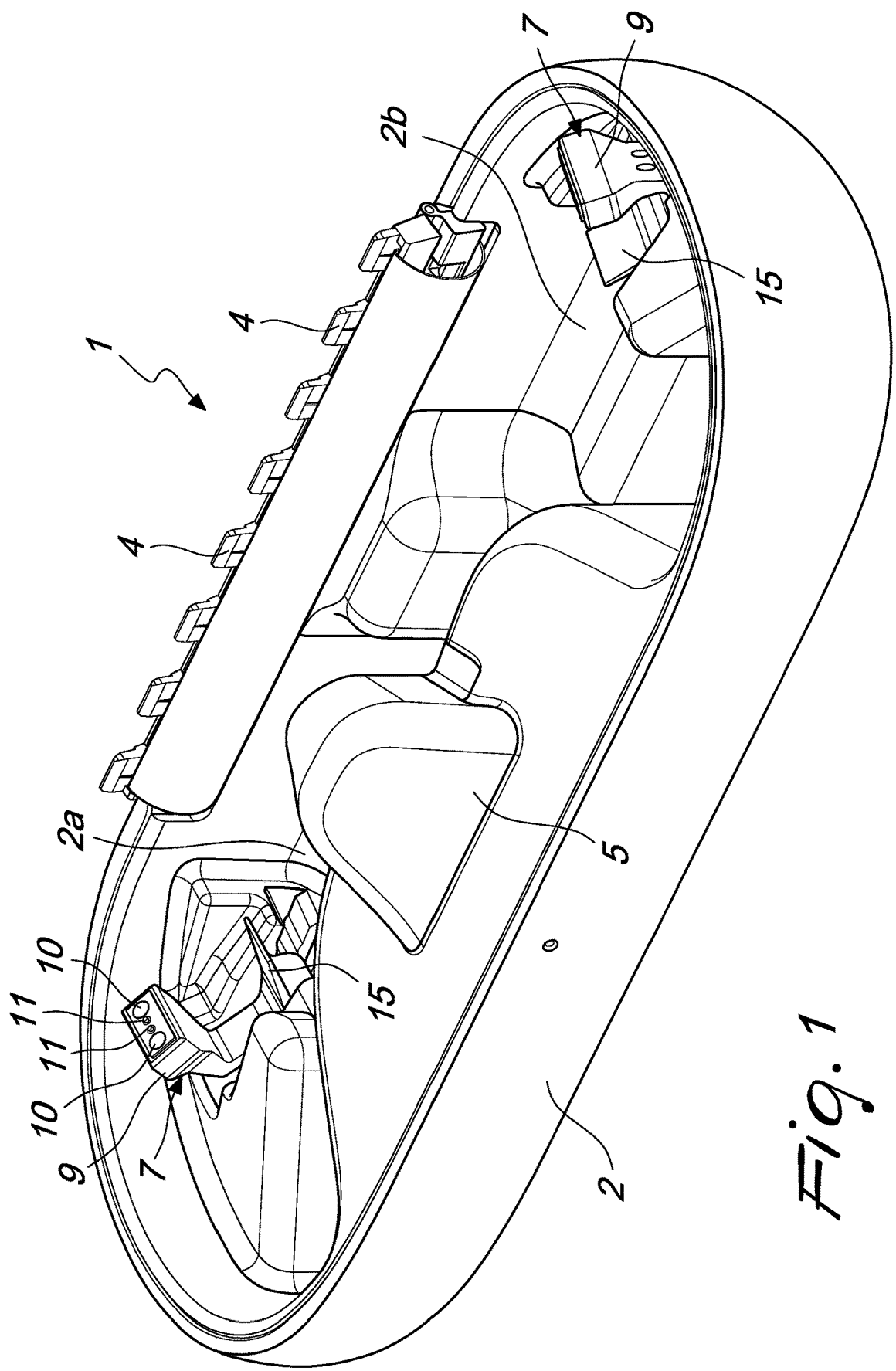
FIG. 1 is a perspective view of the case for electronic devices according to the present disclosure.
Figure 2:
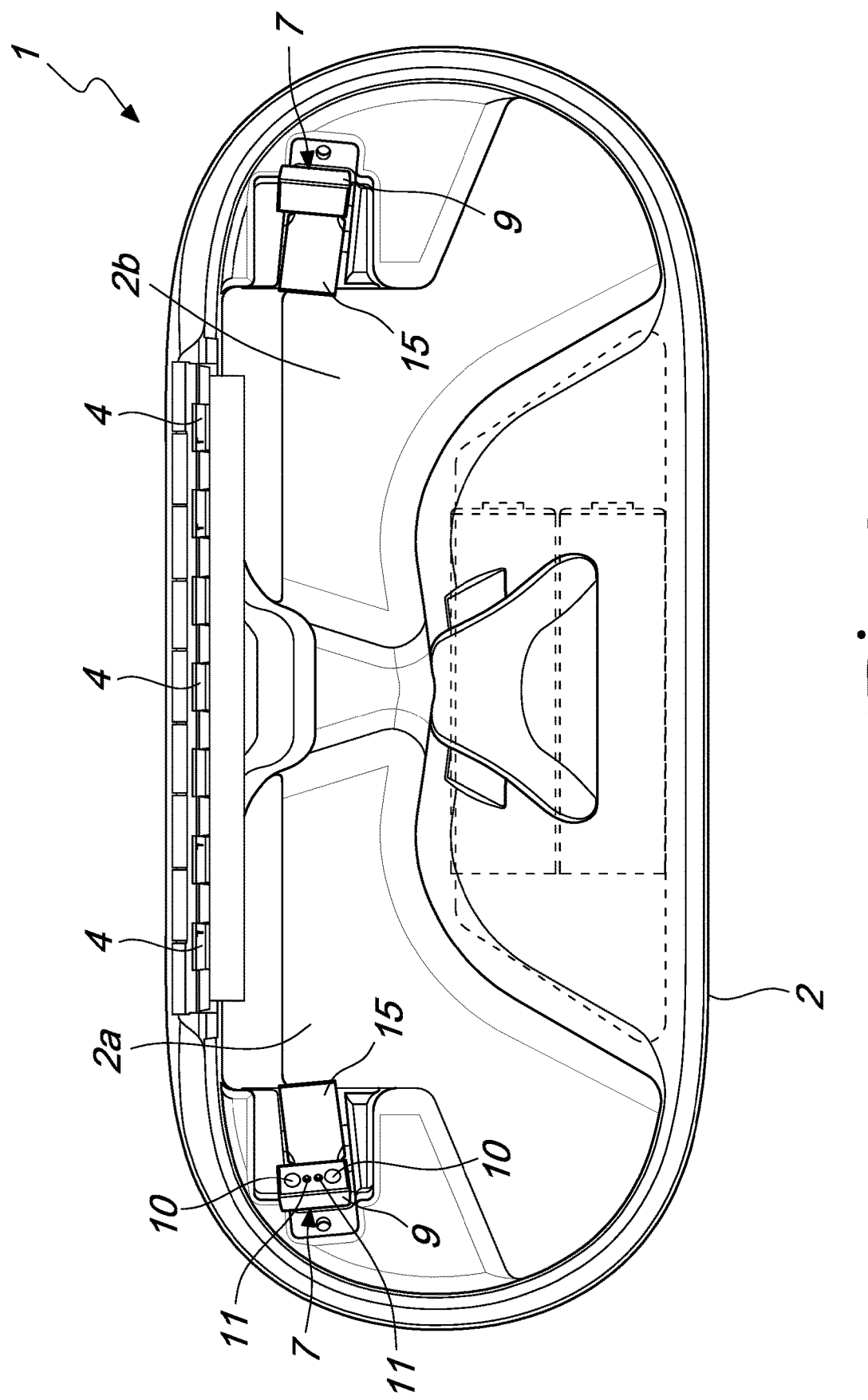
FIG. 2 is a plan view from above of the case according to the present disclosure.
Figure 3:
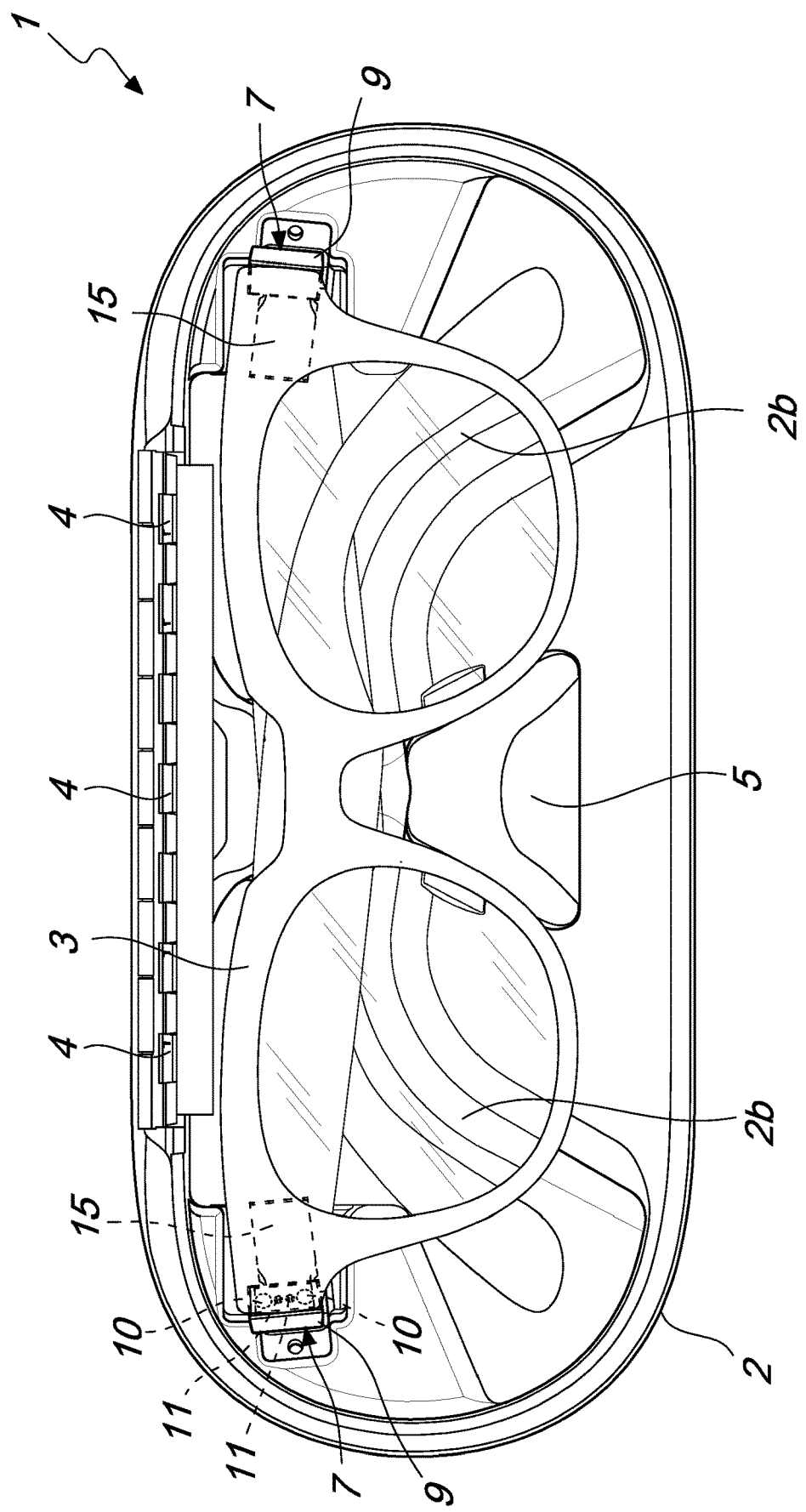
FIG. 3 is a plan view from above of the case according to the present disclosure, with a pair of electronic eyeglasses accommodated in the case.
Figure 4:
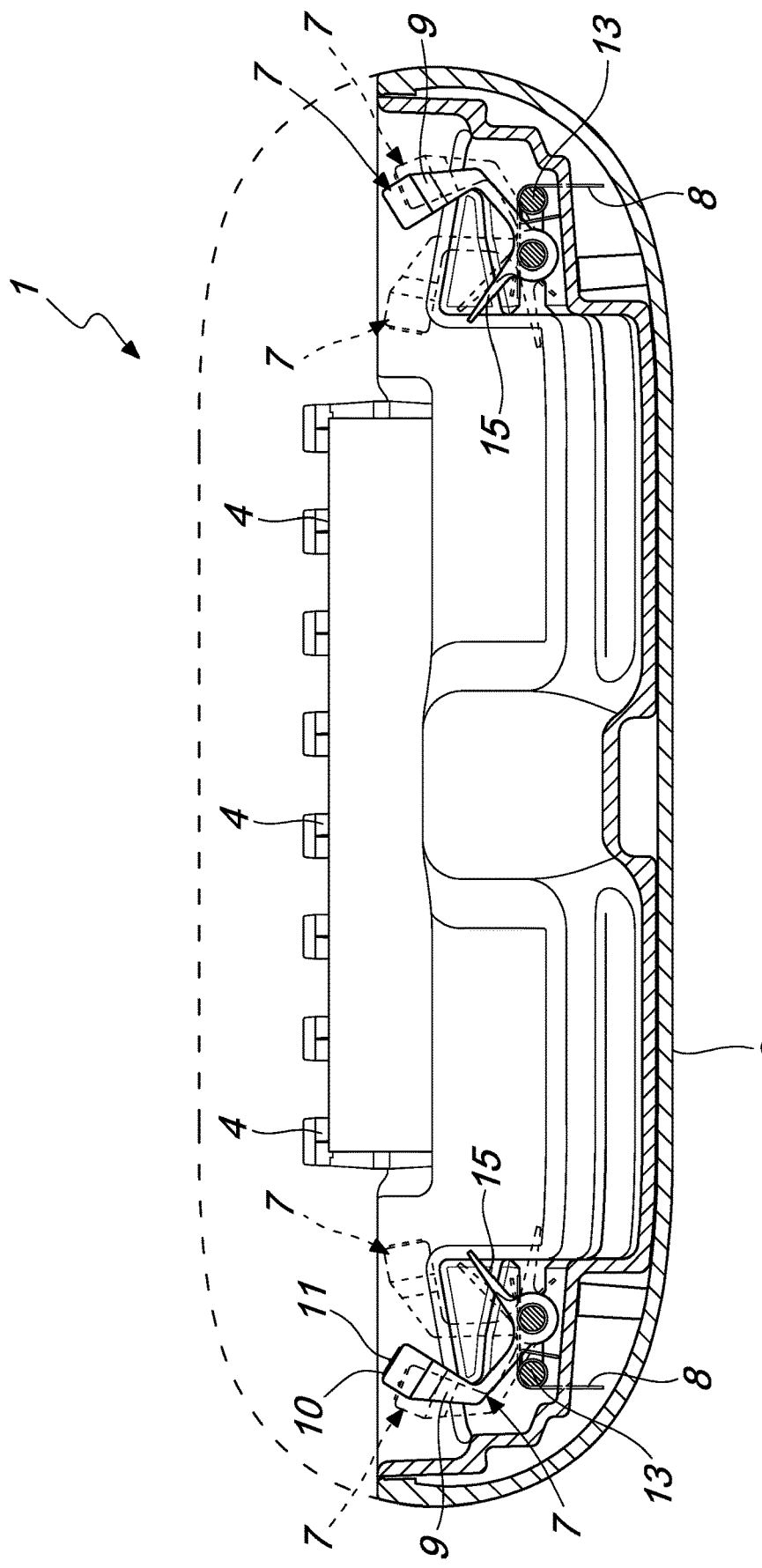
FIG. 4 is a cross-sectional front elevation view of the case according to the present disclosure.
Figure 5:
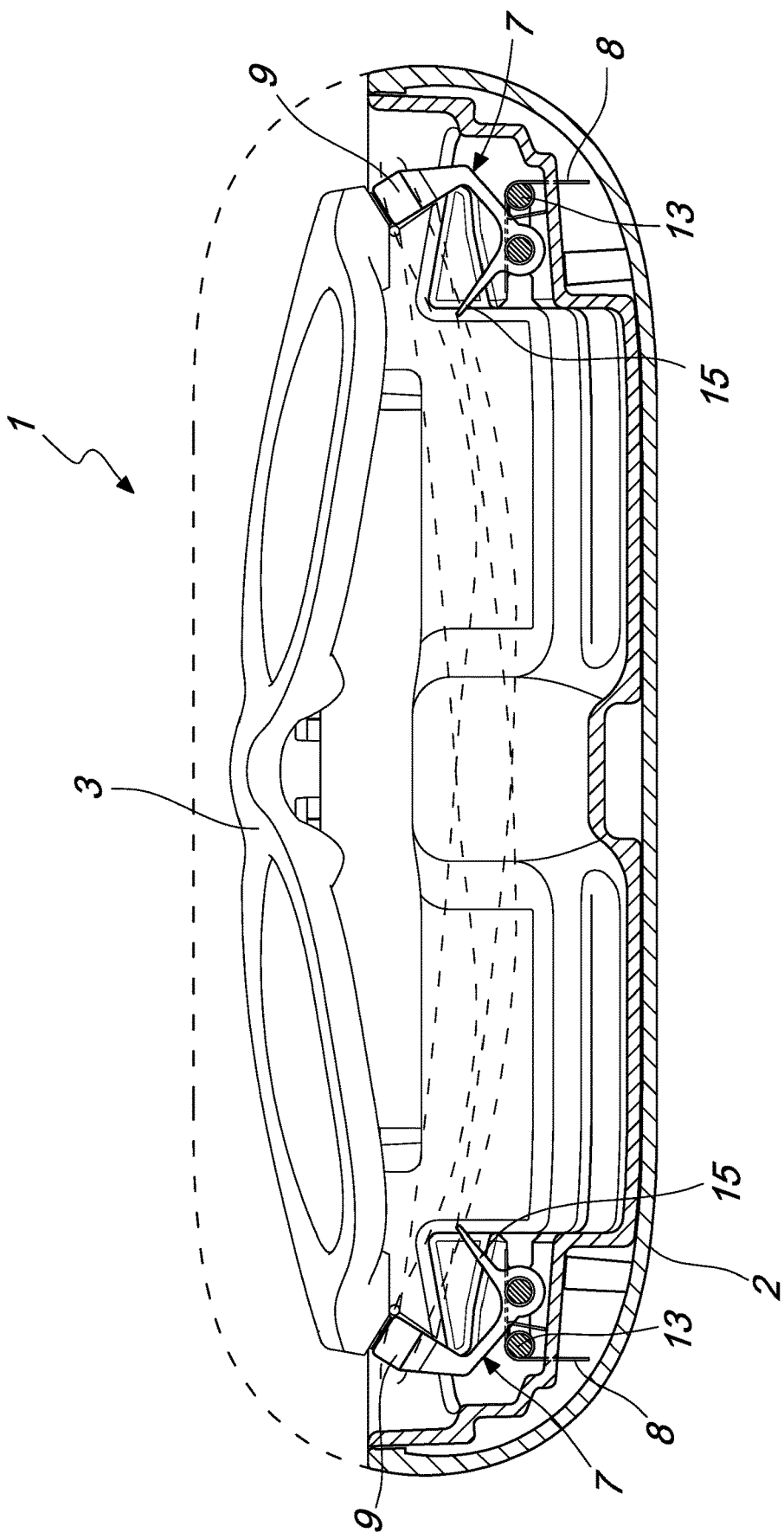
FIG. 5 is a cross-sectional front elevation view of the case according to the present disclosure, with the pair of electronic eyeglasses accommodated in the case.

With reference to the figures, the case for electronic devices according to the present disclosure, generally designated by the reference numeral 1, comprises a case body 2 that is adapted to accommodate an electronic device 3, for the purposes of example in the figures and in all of the description is a pair of electronic eyeglasses.

Conveniently, the case body 2 is defined by two half-shells coupled together using a hinge 4. In the figures only the lower half-shell is indicated, which is the one that accommodates the eyeglasses, the cover of the case being illustrated with dotted lines for the sake of simplicity.

Conveniently, the body 2 has at least one recessed region which is adapted to accommodate an electronic device 3 and, if the electronic device is a pair of electronic eyeglasses 3, preferably two recessed regions 2a and 2b, arranged mutually opposite, which are adapted to accommodate the lenses of the eyeglasses 3, and a raised portion 5 which can be adapted to the nosepiece of the eyeglasses 3, thus enabling a stable accommodation of the eyeglasses 3 when inserting them in the case body 2.

At each one of the receptacles 2a and 2b for the lenses of the eyeglasses 3 retention means 7 are provided, conveniently designed so as to rock against the action of elastic means 8.

Conveniently, the rocking retention means 7 are substantially C-shaped and the upper arm of the C, indicated with the reference numeral 9, accommodates, at its head end, magnets 10 and pins 11 which are adapted to make contact with the charging points provided at the region of the hinge of the eyeglasses, generally at the region of the front of the eyeglasses that is adjacent to the hinge, when the eyeglasses 3 are placed in the case body 2 with the temples folded.

Substantially, the eyeglasses 3 are inserted in the case body 2 with the hinge joining the temple and the front being positioned in the rocking retention means 7, so that the rocking retention means, with their upper arm 9, come to retain the temple of the eyeglasses when it is folded.

In substance, therefore, the temple rests against the lower arm 15 of the rocking retention means 7 with its external surface, while the upper arm 9 rests against the head end of the temple, with the magnets 10 and the pins 11 simultaneously making contact with a charging area of the eyeglasses, which is defined at the region of the front that is adjacent to the hinge and against which the end of the temple is normally in abutment when the temple is in the open condition.

At least one of the rocking retention means 7 is provided with magnets 10 and pins 11, while the opposite rocking retention means 7 have a retention function only.

In the inactive position, the rocking retention means 7 are positioned rotated so that the lower arm 15 is substantially directed upward as is the upper arm 9.

Conveniently, the elastic means 8 are pivoted around a fulcrum 13 and allow the rocking retention means 7 to rotate from the inactive position, described above, in a clockwise direction, to the active position in which the immobilization of the eyeglasses 3 occurs and the charging thereof occurs by way of the magnets 10 and the pins 11.

The elastic means can be made of rigid plastic material or they can be of flexible rubber, in order to compensate also for tolerances or dimensional changes of the eyeglasses frame.

The purpose of the magnets 10 is to retain the eyeglasses 3 by acting on the metallic part of the hinge and so immobilizing the eyeglasses 3 in their receptacle in the case body 2.

In practice it has been found that the case for electronic devices, such as for example electronic eyeglasses, according to the disclosure fully achieves the set aim and advantages, in that it makes it possible to stably and securely accommodate an electronic device such as a pair of electronic eyeglasses, without the user needing to perform any special action to position the eyeglasses in the case, and without needing to use retention means at the nosepiece of the eyeglasses.

The immobilization of the eyeglasses occurs, in fact, simply by inserting the eyeglasses into the case body, placing the eyeglasses at the rocking retention means, and then performing an action of pressure such means so as to let them rock in order to rotate about their own fulcrums of rotation in contrast with the elastic means, in order to pass from an inactive position to an active position in which the upper arm of the rocking retention means immobilizes the temple of the eyeglasses and at the same time abuts against the charging area of the eyeglasses.

The case thus conceived is susceptible of numerous modifications and variations, all of which are within the scope of the appended claims.

Moreover, all the details may be substituted by other, technically equivalent elements.

In practice, the materials used, as well as the contingent shapes and dimensions, may be any according to the requirements and to the state of the art.

The invention claimed is:

1. A case for electronic devices, the case comprising: a case body that is adapted to accommodate an electronic device, and is provided with at least one receptacle for the electronic device, further comprising retention means arranged at said at least one receptacle of the electronic device, at least one of said retention means being provided with charging means, said retention means being adapted to pass from an inactive position to an active position, in contrast with an action of elastic means, in which said retention means contact a charging area of said electronic device and at the same time lock said electronic device inside said case body when said electronic device is stored inside said case body.

2. The case according to claim 1, wherein said electronic device is a pair of electronic eyeglasses with respective temples.

3. The case according to claim 2, wherein said retention means contact a charging area of the pair of electronic eyeglasses and at the same time lock the pair of eyeglasses inside the case body when the pair of eyeglasses is stored inside the case body with the respective temples folded.

4. The case according to claim 1, wherein said retention means comprise a pair of magnets and pins for charging said electronic device adapted to be accommodated inside said case body.

5. The case according to claim 2, wherein said elastic means comprise a spring which is pivoted around a fulcrum inside said case body, so as to allow a clockwise rotation of said retention means and a snap action of said retention means in a position for locking said temple of the pair of eyeglasses.

6. The case according to claim 2, wherein said retention means are in an inactive position when they disengaged from temple of the pair of eyeglasses.

7. The case according to claim 2, wherein said retention means are substantially C-shaped, with a lower arm of the C adapted to abut against an external surface of said temple and an upper arm of the C adapted to accommodate, at a head end thereof, said magnets and pins.

8. The case according to claim 7, wherein said upper arm of the retention means is adapted to abut against the head end of said temple in order to lock said pair of eyeglasses inside the body of said case.

9. The case according to claim 1, wherein said elastic means comprise a spring.

10. The case according to claim 1, wherein said elastic means are made of flexible material, preferably of rubber.

11. The case according to claim 1, wherein said elastic means are made of rigid material, for example a polymer.

12. The case according to claim 1, wherein said case comprises said body adapted to accommodate said pair of eyeglasses, said body being made of a lower half shell and a cover which is hinged to said lower half shell.

\* \* \* \* \*